United States Patent [19]

Funada et al.

[11] Patent Number: 5,101,099
[45] Date of Patent: Mar. 31, 1992

[54] IMAGE READING DEVICE WITH DIFFERENT REFLECTIVITY COEFFICIENTS IN A TRANSPARENT LAYER AND A SUBSTRATE

[75] Inventors: Masao Funada; Norikazu Yamada; Kazuhisa Ando, all of Kanagawa, Japan

[73] Assignee: Fuji Xerox Co. Ltd., Japan

[21] Appl. No.: 593,971

[22] Filed: Oct. 9, 1990

[30] Foreign Application Priority Data

Jun. 15, 1990 [JP] Japan .................... 2-155049
Jun. 18, 1990 [JP] Japan .................... 2-157645

[51] Int. Cl.$^5$ .............................. H01J 40/14
[52] U.S. Cl. ...................... 250/208.1; 358/482
[58] Field of Search ............ 250/208.1; 357/30 H, 357/30 K, 30 L, 4 SL; 358/482, 483

[56] References Cited

U.S. PATENT DOCUMENTS

| | | | |
|---|---|---|---|
| 4,675,534 | 6/1987 | Sekimura et al. | 358/482 |
| 4,742,239 | 5/1988 | Nakagawa et al. | 250/208.1 |
| 4,805,032 | 2/1989 | Watanabe et al. | 358/482 |

Primary Examiner—David C. Nelms
Assistant Examiner—Que T. Le

[57] ABSTRACT

An image reading device in which light receiving elements formed on a first substrate are disposed in opposition to light emitting elements formed on a second substrate with a transparent layer being interposed therebetween. The transparent layer is made of a material whose reflectivity is smaller than that of the second substrate. In another embodiment, gas layers are provided between the transparent layer and the light emitting elements and the gas therein has an index of refraction less than the second substrate. Light transmitting windows provided in an opaque electrode of the light emitting elements have peripheral portions where no light is emitted.

66 Claims, 9 Drawing Sheets

IMAGE READING DEVICE WITH DIFFERENT REFLECTIVITY COEFFICIENTS IN A TRANSPARENT LAYER AND A SUBSTRATE

BACKGROUND OF THE INVENTION

1. Field of the Invention

The present invention relates to an image sensor or reading device used for a facsimile, scanner, and the like. More particularly, the present invention relates to the structure to improve the resolution of an image sensor constituting a read section of an image reading device and to prevent an increase of a dark output signal.

2. Description of the Related Art

A conventional image sensor or reading device of the close contact type, which is used for a facsimile, scanner and the like, is made up of a fluorescent lamp, an image sensor with a width equal to the width of an original document, and a 100% magnification optical system for imaging the reflected light from the document on the image sensor. Reflected light representing the optical densities of images on the original document is converted by a linear array of light receiving elements in the image sensor to corresponding electrical signals. The electrical signals are sequentially outputted in the form of image signals corresponding to one scan line (main scan direction) of the original document.

An image reading device using the 100% magnification system may be made more compact than an image reading device using a reduction optical system. In the former image reading device, a rod lens array may be used for the 100% magnification optical system. However, use of the rod lens array limits the degree of size reduction of the image reading device.

To cope with this, an extremely small image reading device has been proposed in which EL light emitting elements and an image sensor of the close contact type are fabricated into a unit.

This type of the image read device will be described with reference to FIG. 1. As shown, the image reading device is structured such that light receiving elements 100 are formed on a substrate 10 in opposition to EL light emitting elements 200 formed on a substrate 20, e.g., glass. A transparent layer 30 is interposed therebetween. The light receiving elements 100 include picture elements (pixels) 101 as optoelectric transducing elements, which are linearly arrayed.

Light emitted from the EL light emitting elements 200 illuminates the surface of an original 400, e.g., a document, that is disposed on the top surface of the substrate 20, which is opposite to the surface in contact with the light emitting elements. The light 500 reflected by the document surface is incident on the pixels 101 of the light receiving elements 100.

In the image reading device, the substrate 20 is made of the same material (glass) as that of the transparent layer 30. Accordingly, the reflectivity of the substrate is equal to that of the transparent layer, which creates the following problems.

Consider a case that the reflected light from the document 400 is incident on pixel 101a of the light receiving elements 100, and the reflected light beams 500 and 600 hit the pixel 101a. The reflected light beam 500 comes from an area A on the document that is to be read by the pixel 101a, but the reflected light beams 600 comes from an area outside the area A. The pixel 101a stores a quantity of charge amounting to a total amount of the reflected light from the area A and the reflected light 600 from outside of the area A. Accordingly, the pixel 101a produces an electrical signal containing unnecessary pictorial information. This reduces the resolution, i.e., modulation transfer function (MTF).

With reference to FIG. 2, in the light-source contained image sensor thus structured, refractive index $n_2$ (about 1.5) of the glass substrate 20, refractive index $n_3$ (about 1.4) of the general adhesive layer 30 and refractive index $n_1$ of gas satisfy the following relation; $n_2 \leq n_3 > \simeq 1.0$. Air must be present between the transparent substrate 20 and the surface of the original (since the original imperfectly contacts the transparent substrate 20). Of the light beams emitted from the EL light emitting element 200, the light beams emitted at angles larger than an angle $\theta_1$ as given by the following relation, are totally reflected on the surface of the transparent substrate 20.

$$\theta_1 = \sin^{-1}(n_1/N_2).$$

Of the light beams totally reflected, the light beams reflected at angles smaller than angle $\theta_2$ as given by the following relation, are not totally reflected at the boundary, but enter the light receiving elements 100 through light incident windows 26 formed in the EL light emitting elements 200.

$$\theta_2 = \sin^{-1}(n_3/n_2).$$

The totally reflected light beams are present regardless of the presence or absence of the original document. Accordingly, by merely turning on the EL light emitting elements 200, part of the emitted EL light will be reflected to be incident on the light receiving elements 100 to cause flare. The dark output signal of the light receiving element 100 becomes larger than ground, and the dynamic range of the light receiving elements 100 becomes more narrow. This is disadvantageous for image reading in multiple gray levels.

With reference to FIG. 3, light receiving elements 100, which are formed on a substrate 10 made of any of glass, ceramic and the like, and EL light emitting elements 200, which are formed on an EL substrate 20 made of transparent material, for example, glass, are bonded by transparent insulating adhesive (adhesive layer 30). The structure extends horizontally as viewed in the drawing (main scan direction).

The light receiving elements 100 include individual electrodes 121, which are made of chromium (Cr), for example, and are discretely arrayed horizontally in FIG. 3 (main scan direction), a strip like optoelectric transducing layer 122 made of amorphous silicon (a-Si), and a strip like transparent electrode 123 made of ITO.

The EL light emitting elements 200 include a transparent electrode 241 made of any of ITO, $In_2O_3$, $SnO_2$, and the like, an insulating layer 242 made of any of $Y_2O_3$, $Si_3N_4$, $BaTiO_3$, and the like, a light emitting layer 243 made of ZnS : Mn, for example, another insulating layer 242 made of the same material as that of the other layer 242, and opaque electrodes 244 made of metal, e.g., aluminum, which are layered in successive order. In the EL light emitting elements thus structured, when a voltage is applied between the transparent electrode 241 and the opaque electrodes 244, the light emitting layer 243 sandwiched by them emits light, which in turn illuminates an original document 400 through the transparent electrode 241. The light emitted from the light emitting layer 243 is emitted from the obverse side of the transparent electrode 241.

Rectangular light emissive windows 245 are formed in the opaque electrode 244. The light emitted from the light emitting layer 243 is reflected by the original document 400, and the reflected light passes through the windows 245 and is incident on the light receiving portions of the light receiving elements 100 (see Japanese Patent Unexamined Publication No. 59-210664).

The image reading device shown in FIG. 3 has the following problems. Light "p" emitted from the light emitting layer 243 of the EL light emitting elements 200 is emitted from the obverse side of the transparent electrode 241. The light illuminates the original document 400, and is reflected by the original document. The reflected light passes through the windows 245 and is incident on the light receiving portions of the light receiving elements 100. In the device, light "q" emitted from the portions of the light emitting layer 243 along the periphery of the windows 245 sometimes passes through the windows 245 and enters the light receiving portions of the light receiving elements 100 directly. It is desirable to receive only the reflected light portion of the emitted light "p." If the direct incident light "q" from the light emitting layer 243 is additionally received, the dark output signal of the image reading device is increased.

Some part of the light "r," which is emitted from the light emitting layer 243, is emitted from the obverse side of the transparent electrode 241, and is not directed from the EL substrate 20 toward the original document 400. Instead, the light is totally reflected on the surface of the EL substrate 20. The totally reflected light r' (part of the emitted light "r" as totally reflected) passes through the windows 245 and enters the light receiving portion of the light receiving elements 100 associated with the window. The totally reflected light r, also increases the dark output signal of the image reading device.

Also, light emitted from the EL light emitting elements is emitted from the obverse side of the transparent electrode 241. When the emitted light "p" passes from the EL substrate 20 toward the original document 400, some part of the emitted light "p" is totally reflected on the surface of the EL substrate 20 due to the difference between the refractive index of the glass of the EL substrate 20 and air present between the original document 400 and the substrate 20. The totally reflected light "s" passes through each window 245 and the light receiving portion of the corresponding light receiving elements 100. The totally reflected light "s" further increases the dark output signal of the image reading device.

SUMMARY OF THE INVENTION

In view of the above background, the present invention has as an object an image reading device wherein the light emitting elements and an image sensor are in close contact and are fabricated into a single unit.

Another object of the present invention is an image reading device wherein light beams reflected from areas of an original document are incident only on certain pixels of the image sensor which are associated with the areas in a manner that enhances the MTF of the image sensor of the image reading device.

A further object of the present invention is an image reading device including an image sensor having a light source that has a structure that will not introduce flare into an image of the original document.

Yet another object of the present invention is an image reading device having EL light emitting elements and light receiving elements that produce image output signals that are free from flare caused by internal reflections.

Yet another object of the present invention is a method of manufacturing an improved light source contained in an image sensor for use in an image reading device which will not cause flare in an image of an original document.

Still a further object of the present invention is an image reading device that cuts off light emitted from light emitting elements from being directly incident on light receiving portions of light receiving elements in order to reduce the dark output from the image reading device.

These and other objects are attained by an image reading device comprising a first substrate having a first surface and a second surface opposite the first surface, a plurality of light receiving elements formed on the second surface of the first substrate, a second substrate having a reflectivity coefficient, a third surface, and a fourth surface opposite the third surface, a plurality of light emitting elements formed on the third surface of the second substrate, and a transparent layer interposed between the second surface and the third surface, the transparent layer having a reflectivity coefficient smaller than the reflectivity coefficient of the second substrate.

In another aspect of the present invention, the transparent layer interposed between the second surface and the third surface has a plurality of depressions therein in a boundary surface with the plurality of light emitting elements and each of the depressions is filled with a gas having a refractive index less than the refractive index of the second substrate.

In yet another aspect of the present invention, the transparent layer includes a gas layer that is filled with a gas having a refractive index less than the refractive index of the second substrate.

In still another aspect of the present invention, the fourth surface is adapted to support an original document such that the document is illuminated by light emitted from the light emitting elements and light reflected by the original surface is incident on the light receiving elements. Each of the light emitting elements includes a light transmissible window for guiding the reflected light to the light receiving elements, and each of the light emitting elements includes a non-light emitting portion along the periphery of the light transmissible window.

DETAILED DESCRIPTION OF THE PREFERRED EMBODIMENTS

Figure 3:
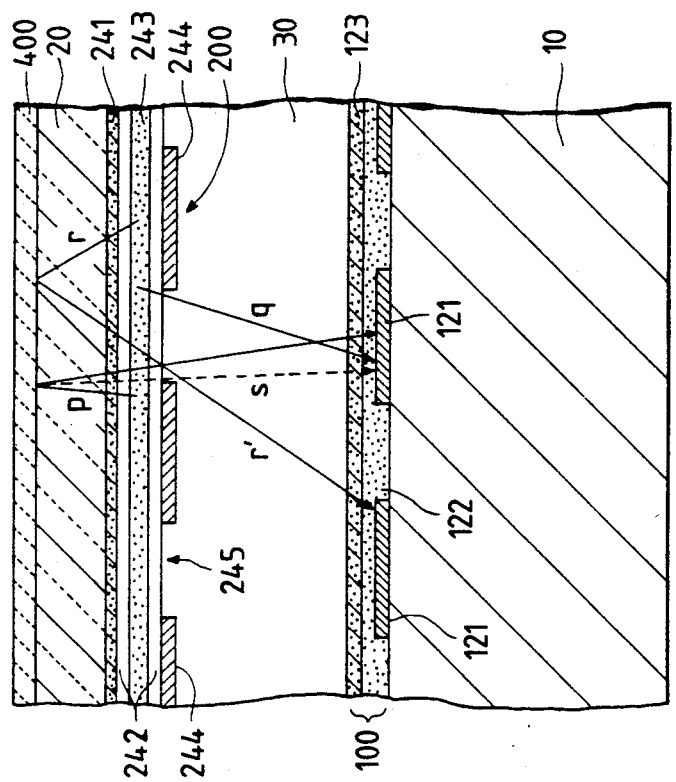
FIG. 3 is a sectional view also showing a conventional image reading device.

The present invention includes an image reading device in which light receiving elements formed on a first substrate are disposed in opposition to light emitting elements formed on a second substrate with a transparent layer being interposed therebetween. An original document is disposed on the top surface of the second substrate. The bottom surface of the second substrate has a plurality of light emitting elements, and light reflected from the surface of the original document is incident on the light receiving elements.

In the present invention, the transparent layer is made of a material whose reflectivity is smaller than that of the second substrate that is disposed between the original document and the light receiving elements. A light beam reflected by the surface of the original document enters from a medium of high optical density to another medium of low optical density. Accordingly, light beams reflected from the original document which enter the transparent layer at an incident angle larger than a critical angle as determined by a ratio of the reflectivity of the second substrate and that of the transparent layer, are totally reflected on the upper surface of the transparent layer. Thus, the light receiving elements reject such reflected light beams.

In another aspect of the present invention, a light source is contained in an image sensor in which a number of light receiving elements are formed on a substrate and light emitting elements are formed on a transparent substrate with a transparent layer disposed therebetween. An original document placed on the surface of the transparent substrate which is opposite to the surface closest to the light emitting elements, is illuminated with light emitted from the light emitting elements, and light reflected from the surface of original document is incident on the light receiving elements. The transparent layer on the light receiving elements is partly or entirely removed, and gas layers are provided facing the light emitting elements.

The present invention further contemplates a method of forming an image sensor including a light source. The method comprises a step of forming light receiving elements on an insulating substrate, and successive steps of forming a transparent electrode, a dielectric layer, a light emitting layer, a dielectric layer, and a metal layer on a transparent substrate. Light incident windows are formed in the metal electrode to form EL light emitting elements. The surface of the insulating substrate on which the light receiving elements are formed is coated with adhesive to bond the light receiving elements and the EL light emitting elements together so that light incident windows of the light receiving elements respectively align with light incident windows of the EL light emitting elements. Gas layers are held by the light incident windows closer to the dielectric layer.

The present invention further contemplates an image reading device of the type in which light receiving elements are formed on a first substrate and EL light emitting elements having a transparent electrode, a light emitting layer, and an opaque electrode are formed on a second substrate so that the first and second substrates face outwardly.

Light emitted from the EL light emitting elements toward the surface of an original document on the surface of the second substrate which is opposite to the surface closest to the light receiving elements is reflected by the original document. Light transmitting windows provided in the opaque electrode guide the reflected light to the light receiving elements. A portion of each EL light emitting element along the periphery of each window is a portion where no light is emitted.

Figure 1:
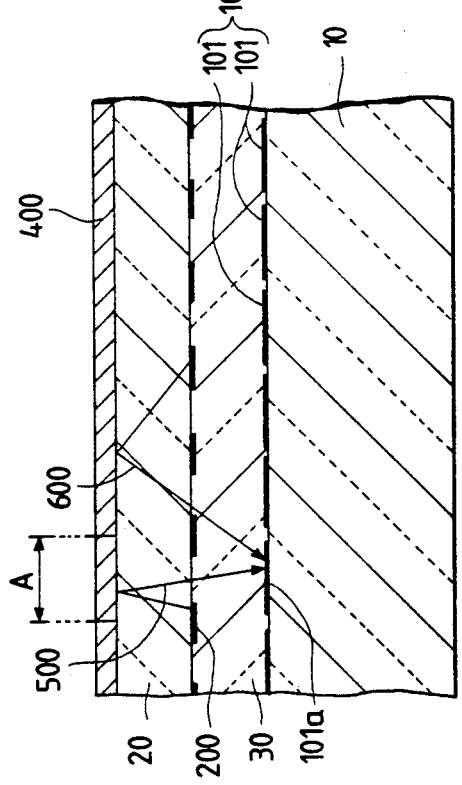
FIG. 1 is a sectional view showing a conventional image reading device of the type in which the light emitting elements and the light receiving elements are fabricated into a single unit.
Figure 2:
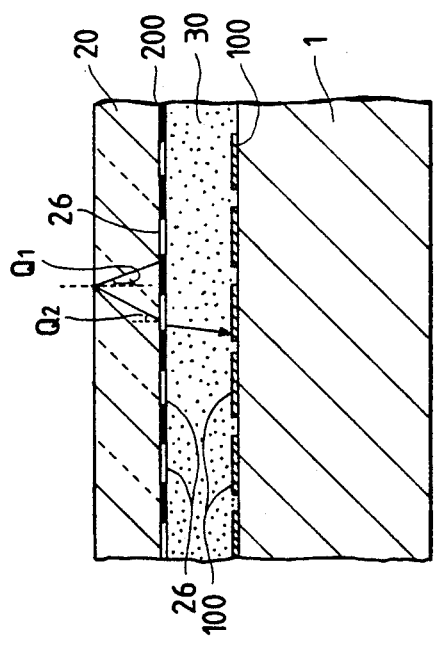
FIG. 2 is a sectional view showing a conventional light source contained in an image sensor.
Figure 4:
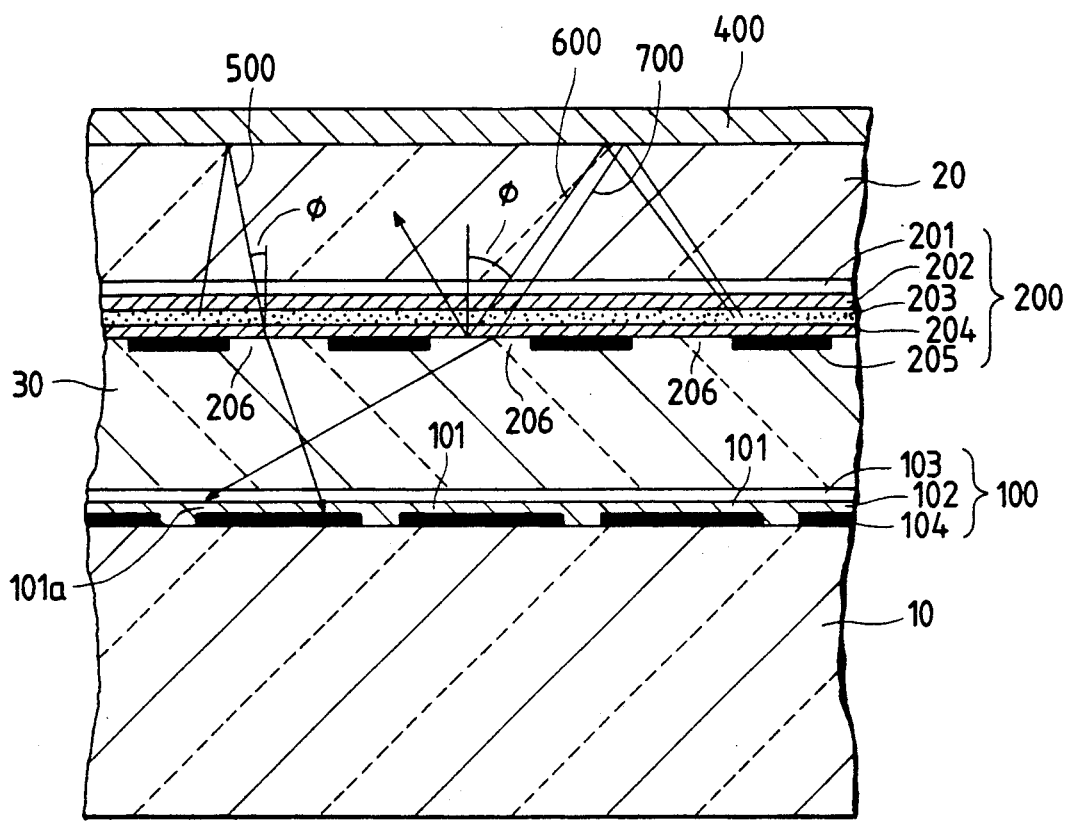
FIG. 4 is a sectional view showing an image reading device according to an embodiment of the present invention.
Figure 5:
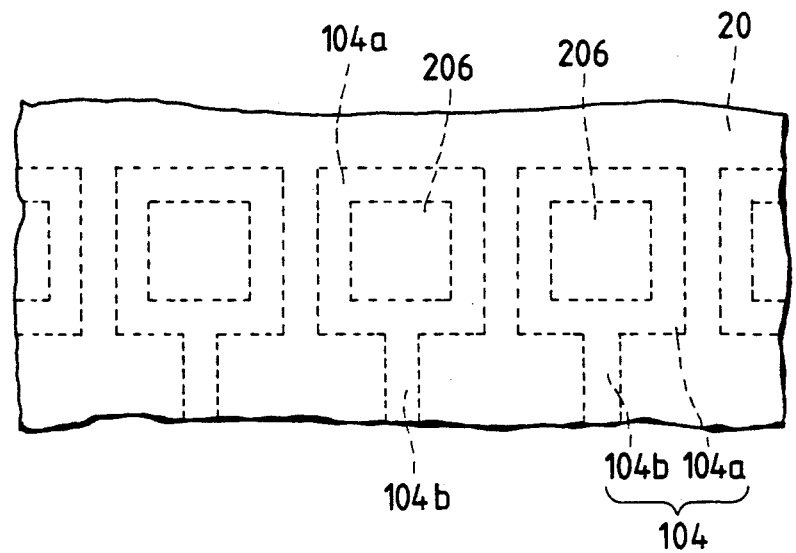
FIG. 5 is a plan view showing the image reading device of FIG. 4.

FIGS. 4 and 5 show a structure of an image reading device according to an embodiment of the present invention. In the figures, like reference symbols are used for designating like or equivalent portions in FIG. 1.

As shown, in the image reading device, light receiving elements 100 formed on an insulating substrate 10 and an EL light emitting elements 200 formed on a transparent insulating substrate 20 sandwich a transparent layer 300. The light receiving elements 100 include sensor pixels 101a of the sandwich structure.

A photoconductive layer (a - Si) 102 is sandwiched by individual electrodes (chromium pattern) 104. Each electrode 104 includes a rectangular pixel portion 104a and a lead portion 104b, and a strip like common electrode (ITO) 103. Each portion where the pixel portion 104a, photoconductive layer 102, and a common electrode 103 overlap one another, serves as an optoelectric transducing elements.

The EL light emitting elements 200 comprise a light emitting layer 203 made of ZnS : Mn, for example, which is sandwiched by insulating layers 202 and 204 made of any of materials of $Y_2O_3$, $Si_3N_4$, $BaTiO_3$, and the like. The structure thus formed is sandwiched by a common electrode 201 made of any of materials, ITO, $In_2O_3$, $SnO_2$, and the like, and opaque metal electrode 205 made of aluminum, for example.

Light incident windows 206, as defined by the adjacent metal electrode 205, are formed so that light emitted from the light emitting layer 203 illuminates the document 400, and light reflected from the document 400 is reflected to the incident on the light receiving elements 100. The windows 206 are disposed above respective pixel portions 104a of the light receiving elements 100.

The MTF of the light receiving elements 100 depends largely on the distance between the window 206 of the metal electrode 205 and the document 400 (equal to the thickness of the insulating substrate 20), and the distance between the light receiving elements 100 and the windows 206 of the electrode 205 (equal to the thickness of the transparent layer 203), provided that the areas of the windows 206 of the metal electrode 205 fall within a predetermined area. It is for this reason that the transparent layer 30 is used as a spacer to secure the distance between the EL light emitting elements 200 and the light receiving elements 100. The layer 30 may be a transparent glass substrate or a thick, transparent adhesive layer. In this case, the transparent layer 30 is made of a material whose reflectivity is smaller than that of the substrate 20.

In a specific example, a glass substrate of about 1.5 in reflectivity is used for the insulating substrate 20. Resin of the silicon family, whose reflectivity is about 1.4 is used for the transparent adhesive layer forming the transparent layer 30. The glass substrate commercially available is any of the BLC (reflectivity: 1.493) manufactured by Nihon Kenki Glass Co., 1733 (reflectivity: 1.515) by Corning Co., D263 (reflectivity: 1.525) by Shot Co., NA45 (reflectivity: 1.533) by HOYA Co., and others. The silicon family resin may be JCR6125 by TOREY Co.

Alternatively, a glass substrate whose reflectivity is about 1.4 (FK54) is used for the transparent layer. The EL light emitting elements and the light receiving elements are bonded to the respective major surfaces of the glass substrate by transparent adhesive applied as thin films to the major surfaces. In this case, there is no need for selecting transparent adhesive of low reflectivity, because the glass substrate serves as the transparent layer 30.

Further, an optical film of low reflectivity made of $MgF_2$ (n=1.38), for example, may be deposited on the metal film of the EL light emitting elements. Additionally to gain low reflectivity, air (n=1.00) is introduced in place of the adhesive, into only the portions just above the light receiving elements.

To manufacture the image reading device, the light receiving elements 100 and the EL light emitting elements 200 are preferably fabricated in different processes, and then the elements are combined.

Light receiving elements 100 are formed on an insulating substrate 10 made of any of glass, ceramic, and the like. To fabricate the light receiving elements 100, chromium is deposited over the insulating substrate 10, to form a chromium layer. The layer is patterned by photolithography to form individual electrodes 104. Amorphous silicon is applied over the individual electrodes 104 to form a strip like photoconductive layer 102. Indium oxide zinc is deposited over the photoconductive layer 102 to form a strip like common electrode 103.

Any of materials ITO, $In_2O_3$, $SnO_2$, and the like is deposited, by sputtering process, over the transparent insulating substrate 20 (for example, a glass plate 50 μm thick) to form a transparent electrode 201. Any of materials of $Y_2O_3$, $Si_3N_4$, $BaTiO_3$, and the like is deposited over the transparent electrode 201, to form an insulating layer 202. ZnS : Mn, for example, is deposited by a sputtering process, for example, over the insulating layer 202 to form a strip like light emitting layer 203. Metal, e.g., aluminum, is vapor deposited over the insulating layer 204 to form a metal layer. The metal layer is patterned by photolithography to form metal electrode 205 with windows 206 to complete the fabrication of the EL light emitting elements 200.

Adhesive 50 μm thick having a reflectivity smaller than that of the insulating substrate 20 is applied between the insulating substrate 10 with the light receiving elements 100 and the insulating substrate 20 with the EL light emitting elements 200 to form a transparent layer 30. The substrates are bonded together so that the pixels 101a are aligned with respective windows 206.

In the image reading device, a drive signal for activating the EL light emitting elements is applied between the metal electrode 205 and the transparent electrode 201 to cause the portions of the light emitting layer 203 between the metal and transparent electrodes receiving the drive signal to emit light. At this time, the portions of the light emitting layer 203 just above the window 206 emit no light, but light projected upwardly from the light emitting layer 203 illuminates the document 400. The light reflected by the document 400 is incident on the pixels 101a through the respective windows 206.

In the instant embodiment, the transparent layer 30 is made of a material whose reflectivity is smaller than that of the insulating substrate 20. In other words, the insulating substrate 20 (whose reflectivity is $n_1$) is designed to have a higher optical density than the transparent layer 30 (whose reflectivity is $n_2$); $n_1 > n_2$. The reflected light beams 600 incident on the transparent layer 30 at an incident angle $\Phi$ (the angle of the reflected light beams with respect to the normal of the boundary surface) in excess of a critical angle ($\sin^{-1} n_2/n_1$) are totally reflected at the boundary surface. In other words, the transparent layer 30 perfectly rejects (reflects) such reflected light beams. A reflected light beam 700 having an incident angle slightly smaller than the critical angle is refracted away from the pixel 101a by the transparent layer 30. Accordingly, the light beam 700 will never enter the pixel 101a. If it is refracted to enter another pixel, the optical path of the light beam within the transparent layer 30 becomes long, and the intensity of the light beam is attenuated to be negligible. Accordingly, the pixel 101a is not influenced by such a light beam.

As seen from the foregoing description, the reflected light from the document surface is transmitted from the medium of high optical density to another medium of low optical density. With this feature, the reflected light beams incident on the transparent layer at an angle in excess of a critical angle as defined by a ratio of the reflectivities of the media, are totally reflected by the upper surface of the transparent layer. Accordingly, such reflected light beams will not enter the light receiving elements. Only light reflected from an area on the document associated with a specific pixel will be reflected such that it enters that pixel. Consequently, the MTF of the image sensor can be enhanced.

The present invention further contemplates that gas layers may be provided on the side of the EL light emitting elements which is closer to the light receiving elements. The boundary states on both sides of the transparent substrate are equalized. With this, light that is emitted from the EL elements and totally reflected on the boundary of the transparent substrate, which is closest to the original document, is totally reflected again on the boundary between the EL light emitting elements and the gas layers. Accordingly, the light will never enter the light receiving elements.

Figure 6:
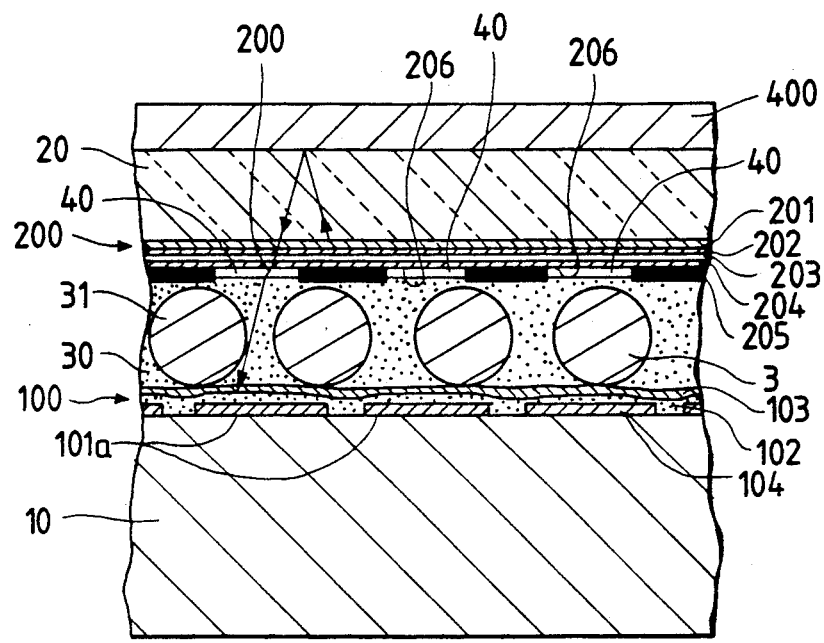
FIG. 6 is a sectional view showing another embodiment of the present invention.

This embodiment of the present invention will also be described with reference to the accompanying drawings. FIG. 6 shows a sectional view of a light source of an image sensor according to an embodiment of the image reading device of the present invention. The sectional view is taken in the main scan direction. In the light source, an image sensor containing a number of light receiving elements 100 linearly arrayed on an insulating substrate 10 and EL light emitting elements 200 are bonded together by an adhesive layer 30 made of transparent material, which is interposed therebetween.

In the image sensor, a number of individual electrodes 104 arrayed in a dot-separation fashion, a strip like photoconductive layer 102 covering the individual electrodes, and a strip like common electrode 103 are formed on an insulating substrate 10 in successive order. Portions of the structure where the photoconductive layer 102 is sandwiched by each electrode 104 and the common electrode 103, serves as each light receiving element 101a.

In the EL light receiving elements 200, a transparent electrode 201, insulating layer 202, light emitting layer 203, insulating layer 204, and metal electrode 205 are successively layered on a transparent substrate 20 of, for example, 100 μm thick. Light incident windows 206, which may be formed as rectangles in the metal electrode 205, are located above the light receiving elements 100, so that light emitted from the light emitting layer 203 and reflected on the surface 400 of an original document will be incident on corresponding light receiving elements 100.

The metal electrode 205 is selected to be (approximately 3 um) thicker than a normal thick film (0.5 to 1 um). A thin gas layer 40 (of approximately 3 um thick), which is filled with material of low refractive index, is provided between the adhesive layer 30 and the insulating layer 204 in each light incident window 206. The gas layer 40 is filled with gas whose refractive index is approximately 1.00, such as air (refractive index: 1.000), argon (refractive index: 1.0003), nitrogen (refractive index: 1.0003), helium (refractive index: 1.0004), and neon (refractive index: 1.00007).

The adhesive layer 30 may contain spherical spacers 31 to maintain the distance between the EL light emitting elements 200 and the light receiving elements 100 constant (in this instance, it is approximately 90 um).

A method of manufacturing the light source for this embodiment will be described.

To form the array of light receiving elements, individual electrodes (chromium) 104 are formed in a horizontal pattern as viewed in the drawing of FIG. 6), amorphous silicon (a - Si) layer 102, and strip like transparent electrodes (ITO) 103 are layered on the insulating substrate 104.

To form the EL light emitting elements 200, a transparent electrode 201 made of any of materials of ITO, $In_2O_3$, $SnO_2$, and the like, an insulating layer 202 made of any of materials of $Y_2O_3$, $Si_3N_4$, $BaTiO_3$, and the like, a light emitting layer 203 made of ZnS : Mn, for example, an insulating material 204 made of the same material as that of the insulating layer 202, and an opaque metal electrode 205 made of aluminum, for example, are successively layered on the transparent substrate 20. The metal electrode 205 is etched by photolithography to form light incident windows 206 located in arrays corresponding to respective light receiving elements 101a. In this case, the metal electrode 205 is deposited to be (about 3 um) thicker than a normal film.

To form the adhesive layer 30, the entire surface of the insulating substrate 10 is coated with adhesive (e.g., JCR6123 manufactured by TOREY SILICON Company, SX2016 by SUMITOMO CHEMICAL Company, or the like) mixed with spherical spacers 31 (e.g., Micro Pearl SP manufactured by SEKISUI FINE CHEMICAL Co., Ltd.). The transparent substrate 20 is disposed such that the light incident windows 206 face respective light receiving elements 101a (pixels). Pressure is uniformly applied over the transparent substrate 20 to form the bond. In this case, since the metal electrode 205 is thick, trenches as for the light incident windows 206 will be formed because the adhesive does not reach a portion of the window closest to the dielectric layer 204. A gas layer 40 is formed in this portion. The spherical spacers 31 are round particles made of hard plastic, and have compatible heat resistive and insulating properties.

Ambient conditions under which the bonding process is conducted determines the kind of gas held in the gas layer 40. To fill the gas layer 40 with air, the bonding process is conducted in dry air. To fill the gas layer 40 with a gas other than air, the insulating substrate 10 and the transparent substrate 20 are placed in a globe box. The globe box is evacuated, and filled with a desired gas, such as argon, nitrogen, or helium. The bonding process is then conducted, and the structure is then heated at 150° C. for one hour to harden the adhesive.

In the light source of the image reading device, gas layers 40 are provided on the side of the EL light emitting elements 200, which is closest to the light receiving elements 100. The boundary states on both sides of the transparent substrate 20 are equalized. With this, light that is emitted from the EL elements toward the original document 400 and totally reflected on the boundary of the transparent substrate 20, which is closer to the original document 400, (the upper surface of the transparent substrate 20) is totally reflected again on the boundary between the transparent substrate 20 and the gas layers 40 (the lower surface of the transparent substrate 20). Accordingly, such reflected light will not enter the light receiving elements 100.

Since the gas layer 40 is thin, about 3 μm, light beam 200 (containing pictorial information on the original document) that is reflected from the original document 400 and transmitted through the gas layer 40, is refracted at the boundary between the gas layer 40 and the adhesive layer 30. Accordingly, the refracted light does not reach a distant place in the main scan direction. Consider this fact by using a single light receiving element 100. The light passing through a light incident window distant from the window 206 right above the light receiving element, viz., unnecessary light that should not enter that light receiving element, can be shut out, preventing the resolution (MTF) from being deteriorated.

In the instant embodiment, of the reflected light from the original document 400, the light at incident angles larger than the angle $\theta_1$ is totally reflected on the lower surface of the transparent substrate 20 to improve the resolution (MTF) of the light receiving elements.

Figure 7:
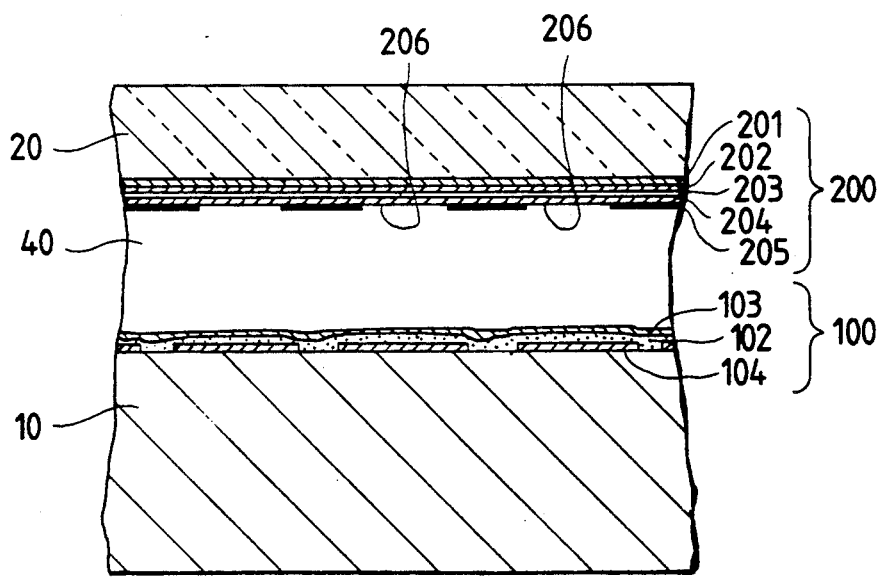
FIG. 7 is a sectional view showing another embodiment of the present invention.

FIG. 7 shows another embodiment of the present invention. In the figure, like or equivalent portions are designated by like reference numerals in FIG. 6.

In the embodiment of FIG. 7, the metal electrode 205 of the EL light emitting elements 20 is designed to have a normal thickness (0.5 to 1 um). A strip like gas layer 40 is provided on the light receiving elements 100.

Figure 8A:
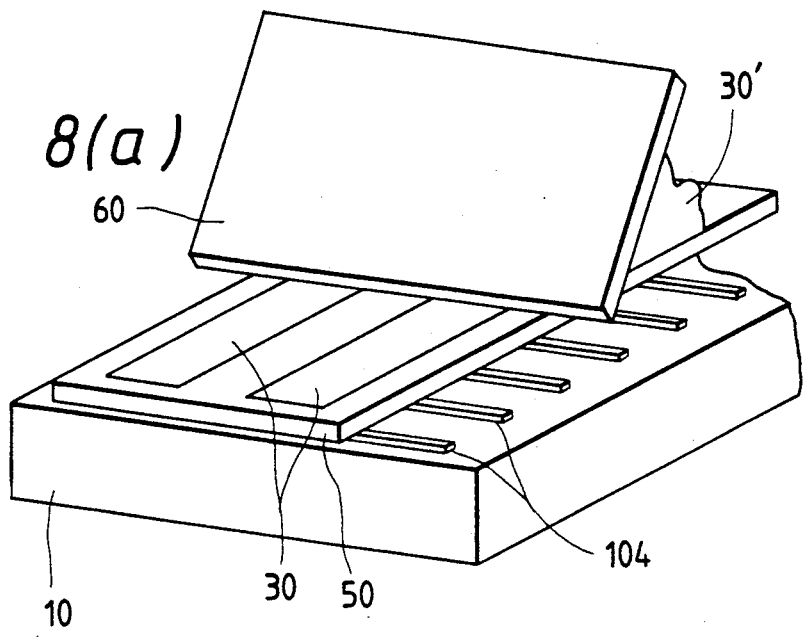
FIGS. 8(a) and 8(b) are perspective views showing steps of a process steps for manufacturing a light source contained in an image sensor of the reading device of the present invention.
Figure 8B:
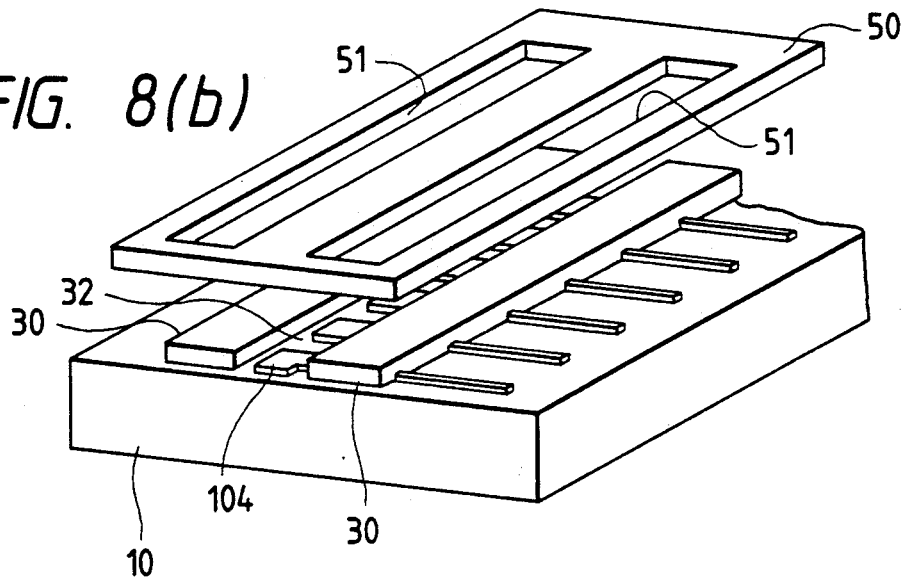

To form the light source, EL light emitting elements 200 are formed on a transparent substrate 20 by a conventional process. A screen mask 50 (FIG. 8(a)) of the emulsion thickness and having two narrow openings 51 is placed on an insulating layer 104. Adhesive 30' containing spacer spheres, as in the previous embodiment, is applied to the openings and is printed by using a squeegee 60 to form a rectangular groove 32 corresponding to the light receiving array (FIG. 8(b)). In FIGS. 8(a) and 8(b), the photoconductive layer 102 and the common electrode 103 of the light receiving elements 100 are omitted, for simplicity. Hardness of the squeegee 60 is preferably high, in order that the adhesive layer 30 is flush with the screen mask. The thickness of the screen mask 50 is selected to be preferably 5 to 30 um greater than the diameter of the spacer spheres.

The insulating substrate 104 with the light receiving elements 100 and the transparent substrate 20 are combined together so that the groove 32 (where no adhesive is printed) is located above the light receiving element array, and the light incident windows 206 of the EL light emitting elements 200 correspond to the light receiving elements 100. Force is uniformly applied to the transparent substrate 20, to form the bond. As already stated, the ambient condition under which the bonding process is conducted determines the type of gas held in the gas layer 40.

The screen mask 50 may be replaced by a metal mask.

In the present invention, gas layers are provided on the side of the EL light emitting elements, which is closer to the light receiving elements. The boundary states on both sides of the transparent substrate are equalized. With this, the light that is emitted from the EL elements and totally reflected on the boundary of the transparent substrate, which is closer to the original document, is totally reflected again on the boundary between the EL light emitting elements and the gas layers. Accordingly, such light will not enter the light receiving elements. As a consequence, the flare problem, i.e., the turning on of the EL light emitting elements to cause an unwanted increase of the output signal of the light receiving elements, can successfully be solved. The resultant decrease in the dark output signal broadens the dynamic range of the light receiving elements. When the dark output signal approaches ground, the load on a dark output correction circuit is lowered.

In the conventional image reading device, the light emitted from the light emitting elements and then directly incident on the light receiving portions of the light receiving elements will inevitably exist to exacerbate dark output signal problem. On the other hand, in this embodiment of the present invention, portions where no light are emitted are provided in a portion of each the EL light emitting elements along the periphery of each the windows. Therefore, the directly incident light is cutoff, and the dark output signal of the image read device will not be increased.

Another embodiment of an image reading device according to an embodiment of the present invention will be described with reference to the accompanying drawings.

Figure 9:
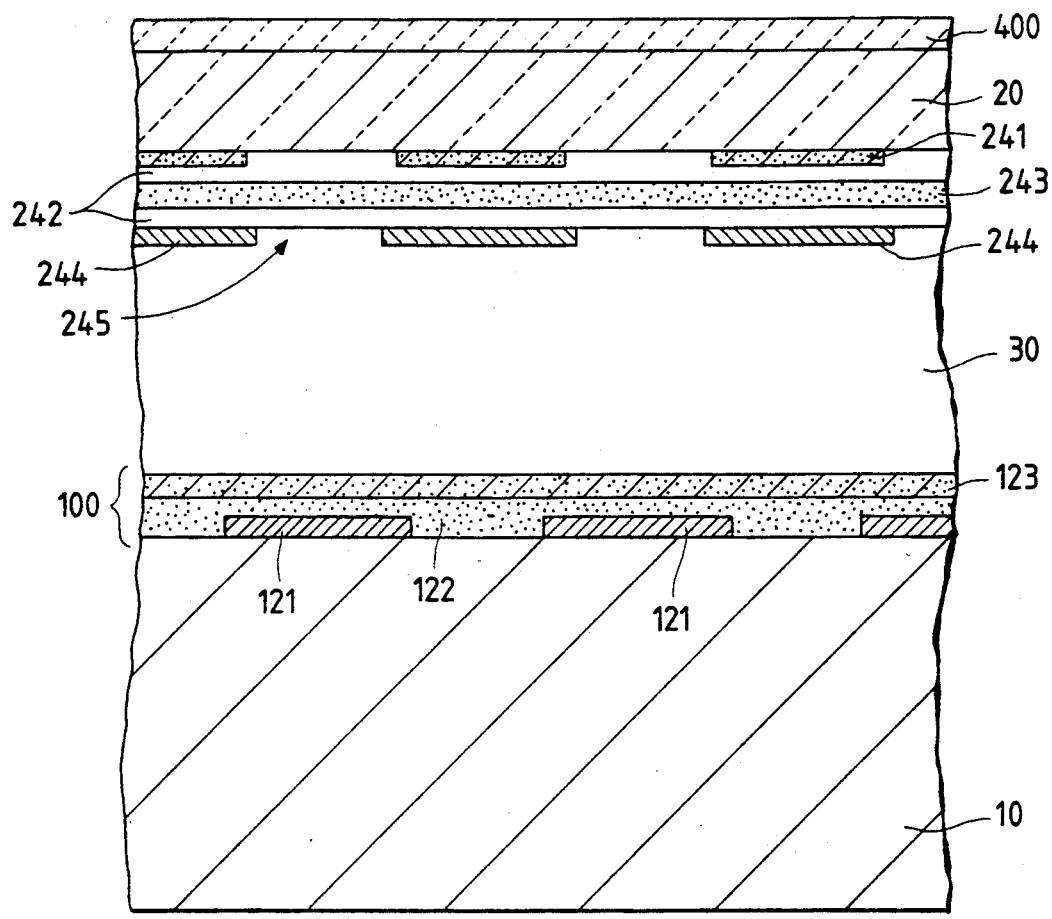
FIG. 9 is a sectional view showing an image reading device according to another embodiment of the present invention.

FIG. 9 is a sectional view of the image reading device according to this embodiment of the present invention. In the figure, like reference symbols are used for designating like or equivalent portions in FIG. 3.

In the image reading device, light receiving elements 100, which are formed on a substrate 10 made of glass, ceramic, or the like, and EL light emitting elements 200, which are formed on an EL substrate 20 made of transparent material, for example, glass, are bonded by transparent insulating adhesive (adhesive layer 30).

To form the light receiving elements 100, individual electrodes 121 made of metal, for example, chromium (Cr) are formed on a substrate 10, an optoelectric transducing layer 22 made of amorphous silicon (a - Si) is formed on the individual electrodes 121. A transparent electrode 123 made of indium oxide zinc (IOT) is further formed on the optoelectric transducing layer.

The lower individual electrodes 121 are discretely arrayed in the main scan direction. The transparent electrode 123 is shaped like a strip and serves as a common electrode. The individual electrodes 121 and the transparent electrode 123 sandwich the optoelectric transducing layer 122 to form the array of light receiving elements 100.

The ends of the discrete electrodes 121 are coupled with a drive IC (not shown). When driven by the drive IC, charges generated in the light receiving elements 100 are derived from the electrodes. In the light receiving elements 100, the amorphous silicon of the optoelectric transducing layer 122 may be replaced by CdSe, for example.

To form the EL light emitting elements 200, a transparent electrode 241 made of any of ITO, $In_2O_3$, $SnO_2$, and the like, is formed on an EL substrate 20. An insulating layer 242 made of any of $Si_3N_4$, $SiO_2$, $Y_2O_3$, and the like, is formed on the transparent electrode 241. Then, a light emitting layer 243 made of ZnS : M, for example, is formed on the insulating layer. Another insulating layer 242 is further formed on the light emitting layer. Finally, an opaque electrode 244 made of aluminum (A1) is formed on the insulating layer 242.

The opaque electrode 244 is opened to form rectangular light transmissive windows 245 (FIG. 11), which are aligned with respective light receiving portions (pixels) of the light receiving elements 100. The light emitted from the light emitting layer 243 is reflected by the original document 400. The reflected light passes through the window 245 and is incident on the light receiving portion of the light receiving elements 100 associated with the window.

Figure 10:
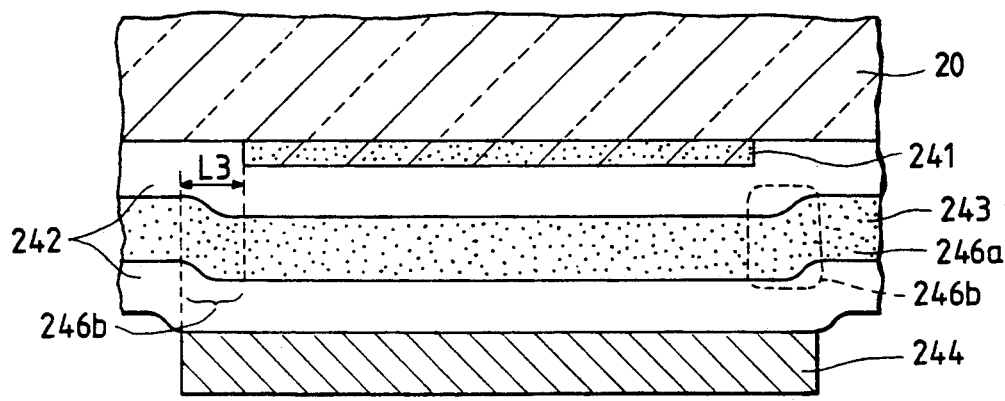
FIG. 10 is an enlarged sectional view of an EL light emitting element used in the light source of FIG. 9.
Figure 11:
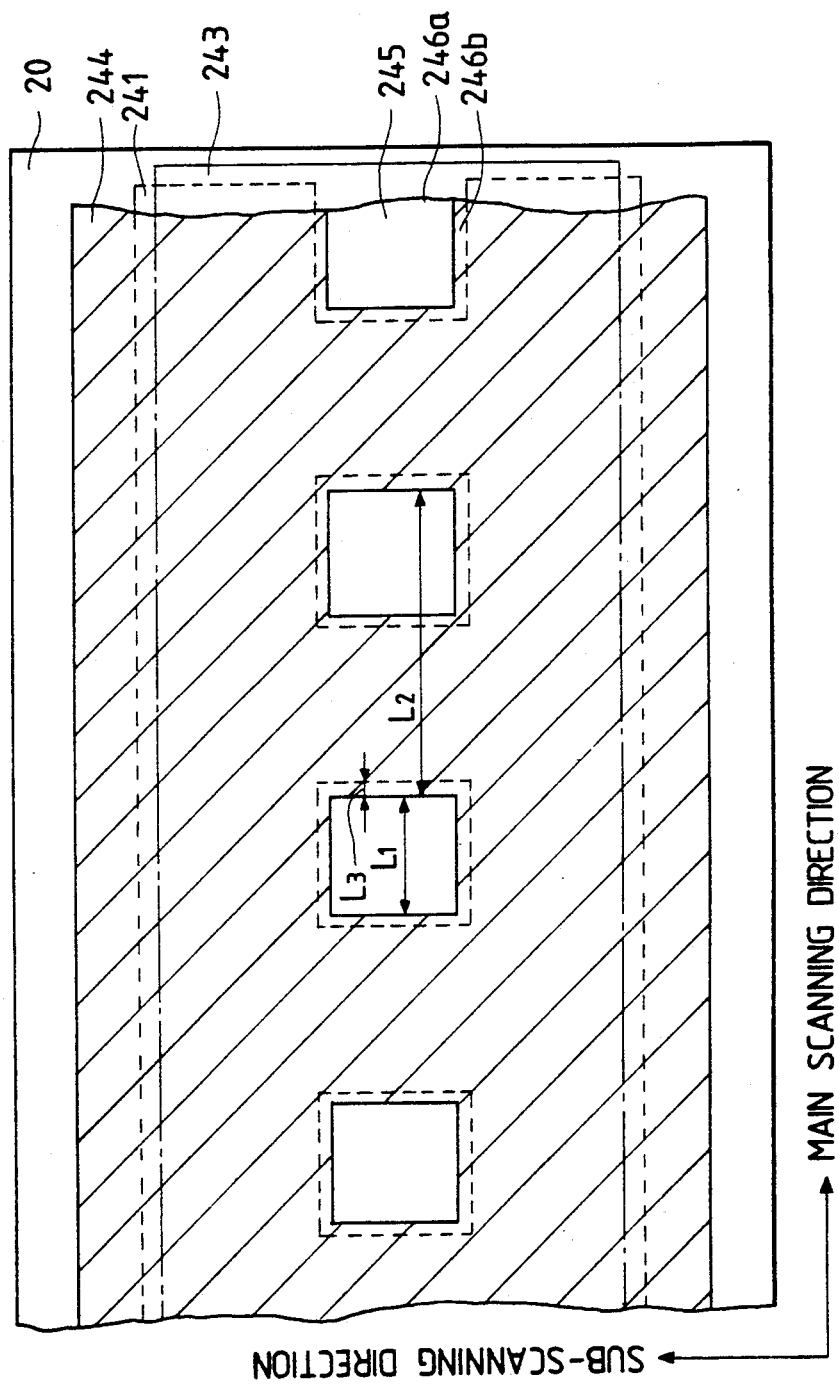
FIG. 11 is a plan view showing the EL light emitting elements shown in FIG. 9.

As well illustrated in FIGS. 10 and 11, which show an enlarged sectional view and plan view of the EL light emitting elements, respectively, the ITO, for example, of the transparent electrode 241 is not formed above the windows 245. The transparent electrode 241 is also not formed in the peripheral portions of the light transmissive windows 245. The portion above the windows 245, and the portion above the peripheral portion of the windows 245 comprise light blocking portions 246a and 246b, respectively.

Figure 12:
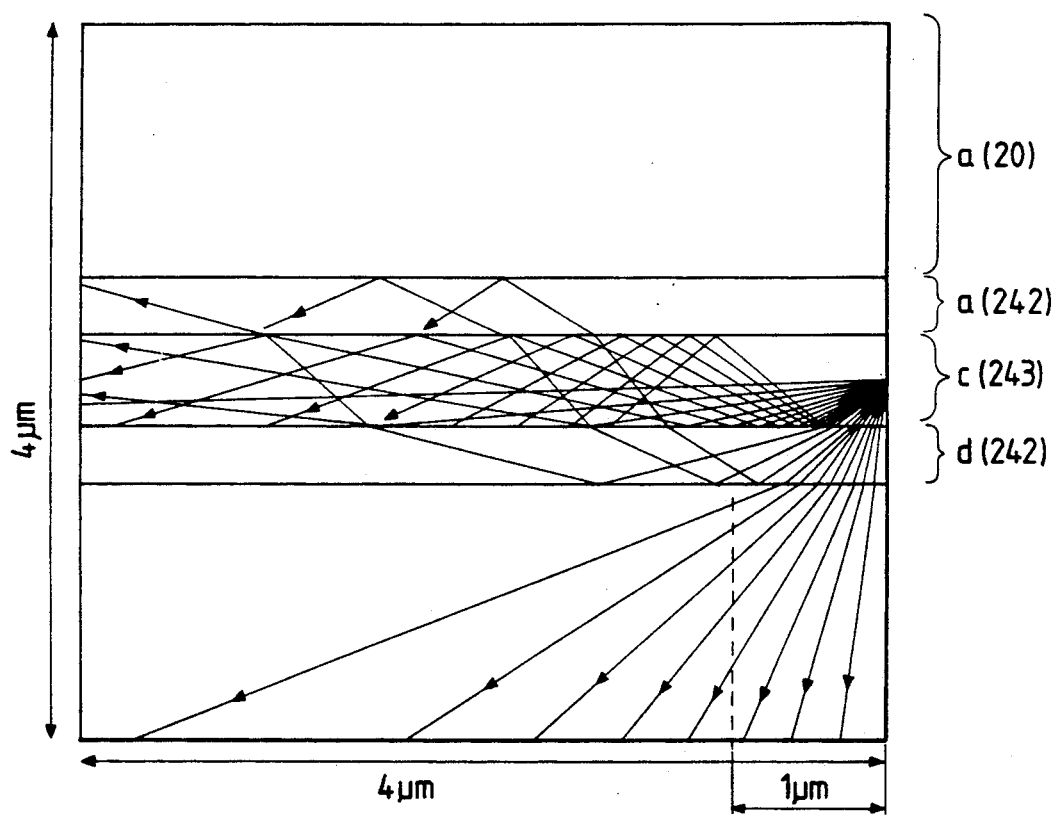
FIG. 12 is an explanatory diagram showing paths of rays of emitted EL light.

The extent of the inner side of the EL light emitting elements that is used for the light blocking portion 246b about the periphery of the window 245 will be described with reference to FIG. 12 showing paths of rays of EL emitted light. In FIG. 12, the EL light is emitted from the center of the right end of the light emitting layer as shown in the figure. The point where the light is emitted will be referred to as light emitting point. The structure of the EL light emitting elements shown in FIG. 12 covers a part of the EL light emitting elements within about 4 μm from the light emitting point. In the figure, the EL substrate 20 ia denoted as "a"; the insulating layers 242 as "b" and "d"; and the light emitting layer 243 as "c." The lower side of the structure as viewed in the drawing is closer to the light receiving elements. As seen from FIG. 12, the light beams within a range of about 1 um from the light emitting point are directly incident on the light receiving elements. Therefore, no IOT is provided in the portion of at least about 1um from the periphery of the window 245 and this portion is used as the light blocking portion 246b.

For the above reasons, the width L1 of the window 245 shown in FIG. 11 is preferably 40 to 60 μm; the width L2 from the window 245 to the end of the next adjacent window is preferably about 125 μm; the width L3 of the light blocking portion 246b above the periphery of the window 245 is preferably about 3 to 4 μm. When the windows 245 in the opaque aluminum electrode 244 are registered with the portions where no transparent electrode 241 is formed, a registration accuracy of approximately 2 to 3 μm is required for best performance. Additionally, the distance of 1 μm as mentioned above is required. It is for this reason that the distance L3 of the light blocking portion 246b is selected to be about 3 to 4 μm.

A method of manufacturing the image reading device will be described. In the method, the light receiving elements 100 and the EL light emitting elements 200 are formed separately, and then are combined.

To manufacture the light receiving elements 100, chromium (Cr) is applied over the entire surface of the substrate 10 made of glass, ceramic, or another suitable material, to form a Cr layer. The Cr layer is coated with resist. By using a mask pattern, the resist is subjected to exposure and developing processes to form a resist pattern. The structure is etched, to remove the resist pattern and consequently to form individual electrodes 121 serving as the lower electrodes.

Amorphous silicon (a - Si) is applied to the structure by P-CV method. Plasma etching by photolithography using $CF_4$, for example, or a patterning vapor deposition process using a metal mask, is applied to the amorphous silicon layer to form strip like optoelectric transducing layer 122 covering the top end portions of the individual electrodes 121. Then, ITO is deposited on the structure by sputtering to form an ITO film. A wet etching using mixed acid and photolithography is applied to the ITO film so that a transparent electrode 123 of the light receiving elements 100 is formed to cover the top end portions of the individual electrodes 121 and to sandwich the a - Si optoelectric transducing layer 122.

A method of manufacturing the EL light emitting elements 200 will be described. ITO, for example, is vacuum deposited or sputtered on an EL substrate 20 that is made of a glass member preferably 50 to 100 μm thick. The deposition is continued until a layer of about 1400 angstroms is formed. The layer of ITO is then patterned by photolithography to form the pattern of transparent electrodes 241 as shown in FIG. 11.

Any of materials of $Si_3N_4$, $SiO_2$, $Y_2O_3$, and the like, is deposited up to approximately 3000 angstroms over the transparent electrodes 241 to form an insulating layer 242. Further, ZnS : Mn, for example, is deposited up to approximately 4000 to 5000 angstroms, over the insulating layer 242 to form a strip like light emitting layer 243, for example, by sputtering or the electron beam method. Another insulating layer 242 of approximately 3000 angstroms is formed over the light emitting layer 243 in substantially the same manner as that of the former insulating layer. Metal, e.g., aluminum is vapor deposited over the insulating layer 242 to form a metal layer approximately 1um thick. Then, the metal layer is patterned by photolithography to form a transparent electrode 244 with light transmissive windows 245.

The light receiving elements 100 and the EL light emitting elements 200 with the light transmissive windows 245 are bonded together by an insulating and transparent bonding layer 30. In this case, the windows 245 are disposed just above the light receiving portions of the light receiving elements 100.

A method of driving an image reading device according to an embodiment of the present invention will be described. To drive, positive and negative pulses of ±150 to 250 V are applied to the electrodes 241 and 244 to cause the light emitting layer 243 that is sandwiched by the transparent electrode 241 and the opaque electrode to emit EL light. At this time, no light is emitted from the light blocking portions 246a, 246b that are above and peripheral to the windows 245 where no transparent electrode 241 is formed. Light is upwardly emitted from the light emitting layer 243 of the EL light emitting elements 200 to illuminate the original document 400 on the EL substrate 20.

The light reflected by the original passes through the windows 245 and is incident on the light receiving portions of the light emitting elements 100. Responsive to the light, the light receiving elements 100 generate electrical charges. The charges generated are outputted in the form of image signals under control of the drive IC.

In the above-mentioned embodiment, for the light emissive windows 245 of the EL light emitting elements 200, an area of approximately 3 to 4 μm in width above the periphery of each window is used as the light blocking window 246a where the transparent electrode 241 is not formed. After reflection from the original document 400, the light that is emitted from the light emitting layer 243 passes through the windows 245 and is directly incident on the light receiving portions of the light receiving elements 100. Therefore, an undesirable increase of the dark output signal of the image reading device is prevented. Also, the dynamic range of the image reading device is expanded to provide a wide range of gradations or gray levels.

In the instant embodiment, the light receiving elements 100 and the EL light emitting elements 200 are bonded by the insulating and transparent bonding layer 30. A transparent layer whose refractive index is smaller than that of the EL substrate 20 may be used for the bonding layer 30. Resin belonging to the silicon family whose refractive index is approximately 1.4 (e.g., JCR6125 manufactured by TORE SILICON company) may used for the transparent layer whose refractive index is smaller than that of the EL substrate 20. An optical thin film made of $MgF_2$ (n=1.38) whose refractive index is small may also be used for the transparent layer. Additionally, the transparent layer may be formed by providing an air layer (n=1.00) on only specific areas on the bonding layer that are just above the light receiving elements 100.

The provision of the transparent layer of small refractive index prevents the totally reflected light within the EL substrate 20 from entering the light receiving elements 100. As a result, the dark output signal can be reduced to be about 86% less than that of the conventional image reading device. Of the remaining 14% of the dark output signal, about 7% appears to be caused by the fact that the EL light reflected by the surface of the EL substrate 20 enters the light receiving elements 100. The remaining dark output signal appears to arise from emitted light that is directly incident on the light emitting elements 100 through the peripheral portions of the windows 245.

When the image reading device according to the instant embodiment is used, the latter 7% of the dark output signal due to the direct incident light can be removed. As explained above, the 7% of the dark output signal due to the surface reflected light can be removed by providing an anti-reflection film of glass or other thin film having a refractive index that is intermediate to the indices of the EL substrate 20 and air.

Figure 13:
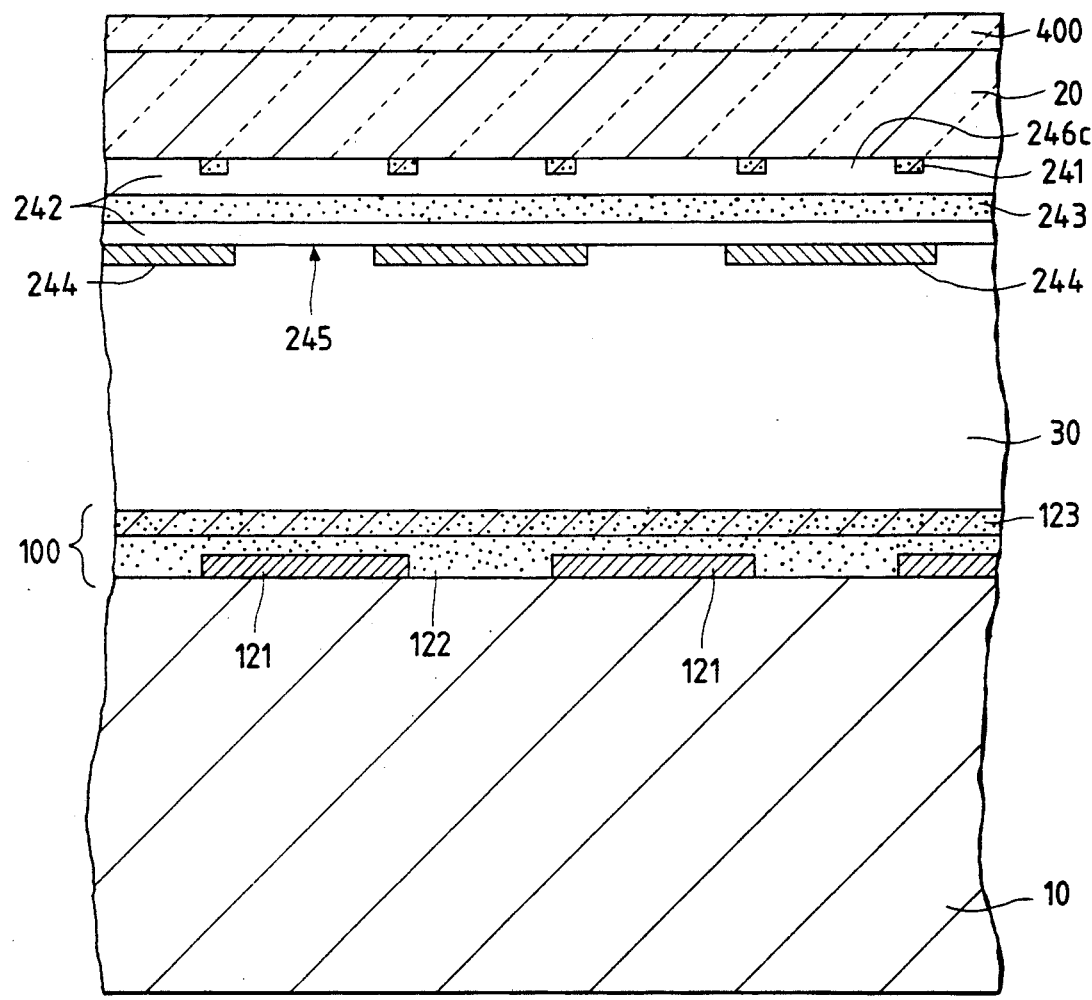
FIG. 13 is a sectional view showing an image reading device according to another embodiment of the present invention.
Figure 14:
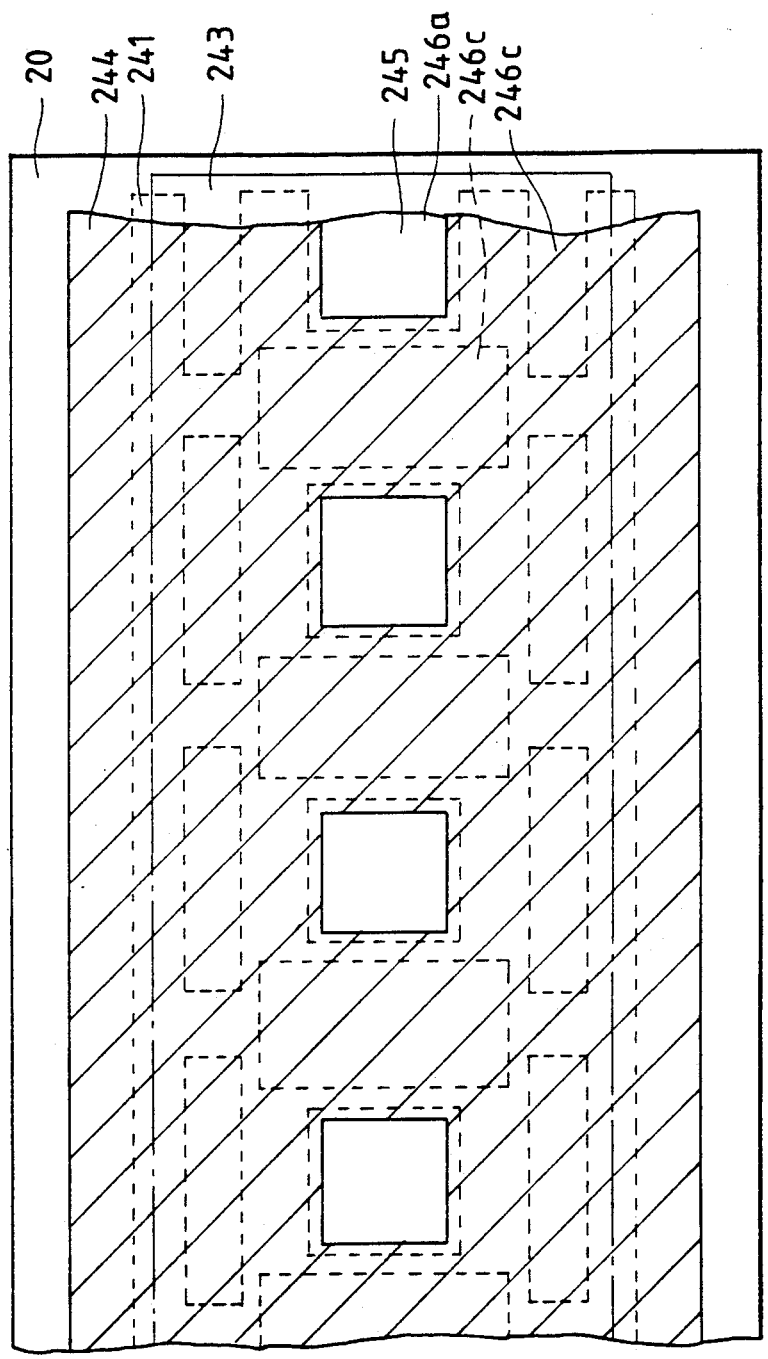
FIG. 14 is a plan view of EL light emitting elements of the image read device shown in FIG. 13.

FIGS. 13 and 14 show respectively a sectional view and a plan view of an image reading device according to yet another embodiment of the present invention. Light blocking portions 246c each provided above the area between the adjacent windows 245 where the transparent electrode 241 is not formed. Light emitted from the light emitting layer 243 illuminates mainly the original document 400 above each light transmissive window 245. Most of the reflected light from the original document 400 is incident on the light receiving portion of the light receiving elements 100 just under associated area of the original document 400. The light blocking portions 246c reduce the light entering the light receiving portions of the adjacent light receiving elements 100. This provides a correctly read image by the light receiving elements 100, and improves the resolution (MTF) of the image reading device.

As seen from the foregoing description, in the EL light emitting elements, the light blocking portions 246a, 246b, and 246c provided around the light transmissive windows prevents direct incident light, i.e., light that is not reflected from the document 400, from being directly incident on the light receiving portions of the light receiving elements through the light transmissive windows can be shut out. Consequently, an increase of the dark output signal can be prevented.

What is claimed is:

1. An image reading device comprising:
   a first substrate having a first surface and a second surface opposite said first surface;
   a plurality of light receiving elements formed on said second surface of said first substrate;
   a second substrate having a reflectivity coefficient, a third surface, and a fourth surface opposite said third surface;
   a plurality of light emitting elements formed on said third surface of said second substrate; and
   a transparent layer interposed between said second surface and said third surface, said transparent layer having a reflectivity coefficient smaller than the reflectivity coefficient of said second substrate.

2. An image reading device according to claim 1, wherein said fourth surface is adapted to support an original document such that the document is illuminated by light emitted from said light emitting elements and light reflected by said original surface is incident on said light receiving elements.

3. An image reading device according to claim 2, wherein said second substrate is transparent.

4. An image reading device according to claim 3, wherein said transparent second substrate is formed of glass or ceramic.

5. An image reading device according to claim 1, wherein said light receiving elements comprise:
   an electrode pattern formed on said second surface;
   a photoconductive layer formed over said electrode pattern; and
   a common electrode formed over said photoconductive layer.

6. An image reading device according to claim 5, wherein said electrode pattern includes a plurality of pixel portions and a lead portion connected with each of said pixel portions.

7. An image reading device according to claim 5, wherein said photoconductive layer comprises amorphous silicon.

8. An image reading device according to claim 5, wherein said electrode pattern is formed of chromium.

9. An image reading device according to claim 1, wherein said light emitting elements comprise:
   a common electrode formed on said third surface of said second substrate;
   a first insulating layer formed on said common electrode:
   a light emitting layer formed on said first insulating layer;
   a second insulating layer formed on said light emitting layer; and
   a selection electrode formed on said second insulating layer.

10. An image reading device according to claim 9, wherein said common electrode is formed of one of the materials of the group comprising ITO, $In_2O_3$, and $SnO_2$.

11. An image reading device according to claim 10, wherein said first and second insulating layers are formed of a material of the group comprising $Y_2O_3$, $Si_3N_4$, and $BaTiO_3$.

12. An image reading device according to claim 11, wherein said light emitting layer comprises ZnS:Mn.

13. An image reading device according to claim 12, wherein said selection electrode comprises an opaque metal.

14. An image reading device according to claim 13, wherein said metal is aluminum.

15. An image reading device according to claim 1, wherein said second substrate comprises glass having a reflectivity coefficient of about 1.5 and said transparent layer comprises silicon resin or glass having a reflection coefficient of less than about 1.5.

16. An method for making an image reading device comprising the steps of:
   providing a first substrate having a first surface and a second surface opposite said first surface;
   forming a plurality of light receiving elements on said second surface of said first substrate;
   providing a second substrate having a reflectivity coefficient, a third surface, and a fourth surface opposite said third surface;
   forming a plurality of light emitting elements on said third surface of said second substrate; and
   providing a transparent layer interposed between said second surface and said third surface, said transparent layer having a reflectivity coefficient smaller than the reflectivity coefficient of said second substrate.

17. The method of claim 16, wherein said step of forming a plurality of light receiving elements comprises the substeps of:
   forming an electrode pattern on said second surface;
   forming a photoconductive layer over said electrode pattern; and
   forming a common electrode over said photoconductive layer.

18. The method of claim 17, wherein said step of forming an electrode pattern comprises the substeps of:
   depositing chromium on said second surface; and
   patterning said deposited chromium by photolithography to form individual electrodes and electrode leads.

19. The method of claim 18, wherein said step of forming a photoconductive layer comprises the substep of applying amorphous silicon over the individual electrodes to form a strip-like photoconductive layer.

20. The method of claim 19, wherein said step of forming a common electrode comprises the substep of depositing indium oxide zinc over the strip-like photoconductive layer.

21. The method of claim 16, wherein said step of forming a plurality of light emitting elements comprises the substeps of:
forming a common electrode on said third surface of said second substrate;
forming a first insulating layer on said common electrode:
forming a light emitting layer on said first insulating layer;
forming a second insulating layer on said light emitting layer; and
forming a selection electrode on said second insulating.

22. The method of claim 19, wherein said step of forming a common electrode on said third surface of said second substrate comprises the substep of sputtering any of ITO, $In_2O_3$, and $SnO_2$ on the third surface.

23. The method of claim 22, wherein said step of forming a first insulating layer on said common electrode comprises the substep of depositing any of $Y_2O_3$, $Si_3N_4$, and $BaTiO_3$ on the common electrode.

24. The method of claim 23, wherein said step of forming a light emitting layer on said first insulating layer comprises the substep of sputtering ZnS:Mn on the first insulating substrate.

25. The method of claim 24, wherein said step of forming a second insulating layer on said light emitting layer comprises the substep of depositing any of $Y_2O_3$, $Si_3N_4$, and $BaTiO_3$ on the light emitting layer.

26. The method of claim 25, wherein said step of forming the selection electrode on said light emitting layer comprises the substeps of:
vapor depositing a metal layer on said second insulating electrode; and
patterning said vapor deposited metal layer by photography to form light emitting windows therein.

27. An image reading device comprising:
a first substrate having a first surface and a second surface opposite said first surface;
a plurality of light receiving elements formed on said second surface of said first substrate;
a second substrate having a refractive index, a third surface, and a fourth surface opposite said third surface;
a plurality of light emitting elements formed on said third surface of said second substrate; and
a transparent layer interposed between said second surface and said third surface, said transparent layer having a plurality of depressions therein in a boundary surface with the plurality of light emitting elements and each of said depressions being filled with gas.

28. An image reading device according to claim 27, wherein each of said depressions is aligned with a different one of said light emitting elements.

29. An image reading device according to claim 27, wherein said gas comprises one of the group comprising air, argon, nitrogen, helium, and neon.

30. An image reading device according to claim 27, wherein said gas has a refractive index and said second substrate has a refractive index larger than the refractive index of said gas.

31. An image reading device according to claim 27, wherein said fourth surface is adapted to support an original document such that the document is illuminated by light emitted from said light emitting elements and light reflected by said original surface is incident on said light receiving elements.

32. An image reading device according to claim 31, wherein said second substrate is transparent.

33. An image reading device according to claim 32, wherein said transparent second substrate is formed of glass or ceramic.

34. An image reading device according to claim 27, wherein said light receiving elements comprise:
an electrode pattern formed on said second surface;
a photoconductive layer formed over said electrode pattern; and
a common electrode formed over said photoconductive layer.

35. An image reading device according to claim 34, wherein said electrode pattern includes a plurality of pixel portions and a lead portion connected with each of said pixel portions.

36. An image reading device according to claim 34, wherein said photoconductive layer comprises amorphous silicon.

37. An image reading device according to claim 34, wherein said electrode pattern is formed of chromium.

38. An image reading device according to claim 27, wherein said light emitting elements comprise:
a common electrode formed on said third surface of said second substrate;
a first insulating layer formed on said common electrode:
a light emitting layer formed on said first insulating layer;
a second insulating layer formed on said light emitting layer; and
a selection electrode formed on said second insulating layer.

39. An image reading device according to claim 38, wherein said common electrode is formed of one of the materials of the group comprising ITO, $In_2O_3$, and $SnO_2$.

40. An image reading device according to claim 39, wherein said first and second insulating layers are formed of a material of the group comprising $Y_2O_3$, $Si_3N_4$, and $BaTiO_3$.

41. An image reading device according to claim 40, wherein said light emitting layer comprises ZnS:Mn.

42. An image reading device according to claim 41, wherein said selection electrode comprises an opaque metal.

43. An image reading device according to claim 42, wherein said metal is aluminum.

44. An image reading device according to claim 27, wherein said transparent layer includes spherical spacers for maintaining a selected separation between said second and third surfaces.

45. An image reading device comprising:
a first substrate having a first surface and a second surface opposite said first surface;
a plurality of light receiving elements formed on said second surface of said first substrate;
a second substrate having a refractive index, a third surface, and a fourth surface opposite said third surface;
a plurality of light emitting elements formed on said third surface of said second substrate; and
a gas layer interposed between said second surface and said third surface, said gas layer being filled with a gas having a refractive index less than the refractive index of said second substrate.

46. An image reading device according to claim 45, wherein said gas comprises one of the group comprising air, argon, nitrogen, helium, and neon.

47. An method for making an image reading device comprising the steps of:
   providing a first substrate having a first surface and a second surface opposite said first surface;
   forming a plurality of light receiving elements on said second surface of said first substrate;
   providing a second substrate having an index of refraction, a third surface, and a fourth surface opposite said third surface;
   forming a plurality of light emitting elements on said third surface of said second substrate; and
   providing a gas layer between said second surface and said third surface, said gas layer being filled with a gas having an index of refraction smaller than the index of refraction of said second substrate.

48. An method for making an image reading device comprising the steps of:
   providing a first substrate having a first surface and a second surface opposite said first surface;
   forming a plurality of light receiving elements on said second surface of said first substrate;
   providing a second substrate having an index of refraction, a third surface, and a fourth surface opposite said third surface;
   forming a plurality of light emitting elements on said third surface of said second substrate;
   forming a transparent layer interposed between said second surface and said third surface;
   forming a plurality of depressions in a surface of said transparent layer bounding said the plurality of light emitting elements; and
   filling each of said depressions with a gas having an index of refraction less than the index of refraction of said second substrate to form corresponding gas layers between said third surface and said transparent layer.

49. The method for making an image reading device according to claim 48, wherein said step of forming light emitting elements comprises the substeps of forming successively a transparent electrode, a dielectric layer, a light emitting layer, a dielectric layer, and a metal electrode layer on said third surface, and forming a plurality of light incident windows in said metal electrode layer to provide said light emitting elements.

50. The method for making an image reading device according to claim 49, wherein said steps of forming said transparent layer and said plurality of depressions in a surface of said transparent layer bounding said the plurality of light emitting elements comprises the substep of coating said light emitting elements and said light receiving elements with a common coat of adhesive to bond said light receiving elements and said light emitting elements together so that light incident windows of said light receiving elements respectively align with said light incident windows of said light emitting elements.

51. The method for making an image reading device according to claim 50, further including the step of forming gas layers in said depressions in said transparent layer.

52. An image reading device comprising:
   a first substrate having a first surface and a second surface opposite said first surface;
   a plurality of light receiving elements formed on said second surface of said first substrate;
   a second substrate having a refractive index, a third surface, and a fourth surface opposite said third surface;
   elements formed on said third
   a plurality of light emitting surface of said second substrate, said fourth surface being adapted to support an original document such that the document is illuminated by light emitted from said light emitting elements and light reflected by said original surface is incident on said light receiving elements, each of said light emitting elements including a light transmissible window for guiding the reflected light to said light receiving elements, and each of said light emitting elements including a non-light emitting portion along the periphery of said light transmissible window; and
   a transparent layer interposed between said second surface and said third surface.

53. An image reading device according to claim 51, wherein each of said light emitting elements includes an opaque electrode and a common electrode, and wherein each of said non-light emitting portions is defined by a cut out portion of said common electrode that is peripheral to said light transmissible window of each of said light emitting elements.

54. An image reading device according to claim 51, wherein said fourth surface is adapted to support an original document such that the document is illuminated by light emitted from said light emitting elements and light reflected by said original surface is incident on said light receiving elements.

55. An image reading device according to claim 53, wherein said second substrate is transparent.

56. An image reading device according to claim 54, wherein said transparent second substrate is formed of glass or ceramic.

57. An image reading device according to claim 54, wherein said light receiving elements comprise:
   an electrode pattern formed on said second surface;
   a photoconductive layer formed over said electrode pattern; and
   a common electrode formed over said photoconductive layer.

58. An image reading device according to claim 56, wherein said electrode pattern includes a plurality of pixel portions and a lead portion connected with each of said pixel portions.

59. An image reading device according to claim 56, wherein said photoconductive layer comprises amorphous silicon.

60. An image reading device according to claim 56, wherein said electrode pattern is formed of chromium.

61. An image reading device according to claim 51, wherein said light emitting elements comprise:
   a common electrode formed on said third surface of said second substrate;
   a first insulating layer formed on said common electrode:
   a light emitting layer formed on said first insulating layer;
   a second insulating layer formed on said light emitting layer; and
   a selection electrode formed on said second insulating layer.

62. An image reading device according to claim 61, wherein said common electrode is formed of one of the materials of the group comprising ITO, $In_2O_3$, and $SnO_2$.

63. An image reading device according to claim 62, wherein said first and second insulating layers are formed of a material of the group comprising $Y_2O_3$, $Si_3N_4$, and $BaTiO_3$.

64. An image reading device according to claim 63, wherein said light emitting layer comprises ZnS:Mn.

65. An image reading device according to claim 64, wherein said selection electrode comprises an opaque metal.

66. An image reading device according to claim 65, wherein said metal is aluminum.

* * * * *

UNITED STATES PATENT AND TRADEMARK OFFICE
CERTIFICATE OF CORRECTION

PATENT NO. : 5,101,099
DATED : March 31, 1992
INVENTOR(S) : Masao Funada et al.

It is certified that error appears in the above-identified patent and that said Letters Patent is hereby corrected as shown below:

Claim 16, column 16, line 35, change "An" to --A--.

Claim 21, column 17, line 17, after "ing" insert --layer--.

Claim 47, column 19, line 6, change "An" to --A--.

Claim 48, column 19, line 22, change "An" to --A--.

Claim 52, column 20, lines 8-9, change "elements formed on said third a plurality of light emitting surface of said second" to --a plurality of light emitting elements formed on said third surface of said second--.

Signed and Sealed this

Twenty-sixth Day of October, 1993

Attest:

BRUCE LEHMAN

Attesting Officer

Commissioner of Patents and Trademarks